United States Patent [19]

Evans

[11] 4,063,350
[45] Dec. 20, 1977

[54] METHOD OF MAKING ELECTRICAL CONNECTIONS

[75] Inventor: Colin Ashcroft Evans, Liverpool, England

[73] Assignee: Plessey Handel und Investments A.G., Zug, Switzerland

[21] Appl. No.: 688,183

[22] Filed: May 20, 1976

[30] Foreign Application Priority Data

May 20, 1975 United Kingdom ............... 21366/75

[51] Int. Cl.² ............................................. H01R 43/00
[52] U.S. Cl. ......................................... 29/628; 29/747; 29/760
[58] Field of Search ............. 29/628, 203 P, 203 MW, 29/745, 747, 753, 754, 751, 752, 760

[56] References Cited

U.S. PATENT DOCUMENTS

| | | | |
|---|---|---|---|
| 3,769,701 | 11/1973 | Kloth | 29/203 MW X |
| 3,861,015 | 1/1975 | Hooven | 29/203 MW |
| 3,913,202 | 10/1975 | Pyle et al. | 29/203 MW |
| 3,949,457 | 4/1976 | Fortsch | 29/203 MW |

FOREIGN PATENT DOCUMENTS 938,688  10/1963  United Kingdom.

Primary Examiner—Carl E. Hall
Attorney, Agent, or Firm—Fleit & Jacobson

[57] ABSTRACT

The invention relates to an installation aid for 5005 Xbar System exchanges to enable a considerable amount of cabling work to be carried out even before racks and suites are installed. The proposal makes use of wiring-biscuits, or plates formed from rigid plastics sheet, each comprising a "break-off" perforated strip for each row of the terminal block and each strip having its perforations at the same centers as the tags or terminals of a row. The method of operating on the end of a cable involves the mounting of the plate in a location close to the position occupied by or to be occupied by the terminal block, the threading of the insulated wires of the cable through particular holes of the plate, the eventual separation of a strip from the plate, the placing of that strip upon a requisite row of terminals of the duly located terminal block so that one wire and one terminal emerge from some or all of the perforations, and then the establishment of gun-wrapped connections between each said terminal and wire. The strip is finally removed but can only be done if no "cross-overs" have been introduced.

5 Claims, 5 Drawing Figures

METHOD OF MAKING ELECTRICAL CONNECTIONS

The present invention relates to cabling and wiring methods and aids for use in the installation of telecommunications exchanges and although it will find immediate utilization in telephone exchanges of the well-known 5005 Crossbar System it is not necessarily limited thereto. The 5005 Crossbar System is typically referred to in the technical journal of the Automatic Telephone & Electric Co. Ltd. entitled "A.T.E. Journal" in Vol. 19, No 1 (1963), pages 16 to 26.

The switching-equipment mounting practice adopted for the 5005 System conforms substantially to that described in British patent specification No. 938,688, in that double-sided racks often arranged in suites of eight are employed; each so-called suite, of which there may be many in a large exchange, comprises racks arranged side-by-side and is usually completed by a supervisory and display panel (known as an end-panel) at one end. Generally the switching equipment in the form of crossbar switches, electromagnetic relays and the like is mounted on horizonatlly-hinged shelves; a rack having one column of ten shelves for each of the front and rear faces. The shelves are contained in a dust-proof region and access to the equipment, for maintenances purposes, would be gained by readily-removable windows of plastics material, provided at each said face on the basis of one per shelf. As disclosed in the prior British patent specification, each rack is provided with two side-walls (right-hand and left-hand) of formed sheet-steel, each having a cross-section of W-form wherein the central re-entrant portion is appreciably shallower than the width of the extensive flat sections which correspond to the outer limbs of the W-form. The side-walls extend the height of the equipment region of the rack and each is secured along the vertical edges of said flat sections to the appropriate pair of four uprights provided one at each corner of the rack; the situation being that the free-ends of the W-form are directed towards the equipment region. The racks of a suite are equi-spaced by suitable struts to provide vertical cabling ducts (also known as inter-rack spaces) between them. Such a duct is constituted by the opposing side-walls (which are closest at the re-entrant portions) and by three hingeable and removable doors, one above the other, at both faces of the suite.

Each of previously-mentioned flat sections of the side-wall of a rack makes an angle of approximately 45° with respect to the appropriate face of the suite, and is provided with a column of 20 rectangular cut-outs, two being provided for each shelf position of a rack face. Accordingly the two side-walls of a rack involve four cut-outs for each shelf, providing for the accommodation of up to four shelf tagblocks, two for each end of the shelf equipment, which terminate appropriate shelf cablearms. The tagblocks, which are also known as terminal blocks, are of the flat-mounting type with double-ended tags or terminals having their ends emerging from opposite surfaces of a rectangular insulator plate. The standardised tagblock comprises fourteen rows of fifteen tags, and its insulator plate is so dimensioned as to enable it to be clamped to cover an appropriate said cut-out after passing it through that cut-out into the duct, whereupon a field of un-used tag-ends is presented into the duct.

The shape of the side-walls of a vertical duct is such that when the shelf tagblocks of the two racks involved have been located, the fields of tag-ends appropriate to shelves of a particular face of said racks are readily accessible through the duct-doors of the face concerned, so that during the exchange installation phase they can be used for gun-wrapped connections involving conductors of inter-shelf, inter-rack and inter-suite cables.

A vertical cabling duct providing access to an array of tagblocks and conforming substantially to those described, is located between the before-mentioned end panel of a suite and the adjacent rack. At the other end of the suite, a duct involving one side-wall of the appropriate rack is evident.

It may be mentioned that overhead channel-type cable runways extending along the rack-suite and between suites are not employed in current 5005 System exchange practice. Instead overhead installer's cabling is located upon a suitably strong and well-secured false ceiling comprising a robust steel-wire mesh having openings of the order of 4in. square. Installer's cables, carrying appropriate identifying labels towards their ends and comprising color-coded plastics-covered wires, are brought down through such openings substantially in line with the centrelines of the vertical cable ducts. This enables the cables to be run directly down the central space forming a runway bounded by the before mentioned re-entrant portions of the rack side-walls whence they are branched as required to specified tagblocks.

Each tagblock has a so-called fanning-strip, and this is located between said central space or runway and the installer's tag-field. The fanning-strip, robustly constructed from plastics material, is provided with fourteen through-holes; one aligned with each row of 15 tags. The end-portion of an installer's cable, or a cable-branch, serving a particular tagblock is skinned, laced and possibly given swan-neck form (as may be required) and is then divided by hand into as many tails as there are tag-rows to be served. The latter procedure involves selection of wires, by color-code, in accordance with an appropriate terminating information list, and takes into account the fact that the tag-rows number 1 to 14 upwardly.

As many as 14 15-wire tails may be formed and these are threaded through appropriate individual holes of the fanning-strip which may already be partly occupied by previously-connected wires of a local inter-shelf cableform.

Gun-wrapping, using an electrically-powered tool which performs cutting, stripping and wrapping functions in one cycle, is now carried-out for each wire, and again the terminating information list is consulted; account also being taken on the fact that the tags in each row are numbered 1 to 15 from the left as viewed from the appropriate face of the rack-suite.

An object of the invention is to provide improved methods and means for executing the cabling and wiring of telecommunications exchanges.

The invention envisages a method of preparing and making connections between insulated wires of a cable and individual tags of a tagblock row, characterised in that an elongated flexible strip having a perforation corresponding to each tag of said row is employed and in which said strip, having the ends of selected wires of the cable threaded into particular individual perforations, is placed upon the tags of said row so that one wire-end and one tag-end emerge from some or all of said perforations whereupon each wire so emerging with a tag is connected to that tag preferably by gun-wrapping.

According to a feature of the invention the tagblock has a fanning strip with a guide-hole for each row of tags, and said flexible strip, together with its threaded wires forming a tail, is fed through the appropriate guide-hole preparatory to said strip being placed upon the tags of said row.

According to another feature of the invention the flexible strip is fabricated integrally of a biscuit, or plate, incorporating a predetermined number of identical strips in side-by-side formation, the strips being readily-separable by breaking connecting webs.

Also according to the invention the number of said strips initially incorporated in a biscuit, or plate, is the same as the number of tag rows in the tagblock to be wired.

According to another aspect of the invention there is provided a method of operating on the end of a multi-conductor cable in relation to a tagblock having its tags arranged in co-ordinate field, the method including the use of a flexible plastics biscuit, plate, comprising an integral readily-detached strip for each row of tags and having a perforation corresponding to each tag of a row, the mounting of the biscuit, or plates in a location close to the position occupied by or to be occupied by the tagblock, the threading of the insulated wires of the cable through particular holes of the biscuit, the eventual separation of a strip from the biscuit, the placing of that strip upon a requisite row of tags of the duly located tagblock so that one wire and one tag-end emerge from some or all of said perforations, and then the establishment of connections between each said tag and wire.

According to yet another feature of the invention there is provided a cabling-aid structure comprising at least one frame having apertures in its wall, each said aperture enabling the perforations of all the strips of an aforesaid biscuit to be displayed in a position appropriate to that occupied or to be occupied by a said tagblock whereupon the insulated wires to be connected to said tagblock are enabled to be inserted through selected perforations of the strips included in the biscuit.

The invention will be better understood from the following description of one method of carrying it into effect which should be read in conjunction with the accompanying drawing comprising FIGS. 1, 2, 2a and 3, and which typically relates to an exchange of the 5005 Crossbar System.

Of the drawing:

FIG. 2 is a view of a portion of the structure of FIG. 1 viewed in the direction of the arrow A, whereas

The invention relates in one interpretation to a situation where a telephone exchange of the 5005 Crossbar System is in course of manufacture, but before any equipment racks have been put into the exchange premises the installer would be enabled to go ahead with much of the installation cabling commitments. These involve the running-in of overhead exchange cables, bringing the label-identified ends of those cables down through the mesh of the false ceiling at positions corresponding to requisite eventual centers of the vertical cabling-ducts. This part of the procedure presents no problem if use is made of floor-markings identifying the locations allocated to the various suites, racks and cable ducts. Indeed, with the floor-area clear of exchange equipment, the operations may be performed more easily and quickly than if the suites were in situ. By the use of the present invention considerable advancement beyond the mere running-in of cables can be effected by installation personnel in a simple and efficient manner, so that when the equipment suites are duly installed, the ensuing phase of the work, mainly comprising the gun-wrapping of the cable wires upon requisite tags of the various tagblocks in the cabling ducts, can be done simply, quickly and reliably without constant reference to terminating information lists.

Figure 1:
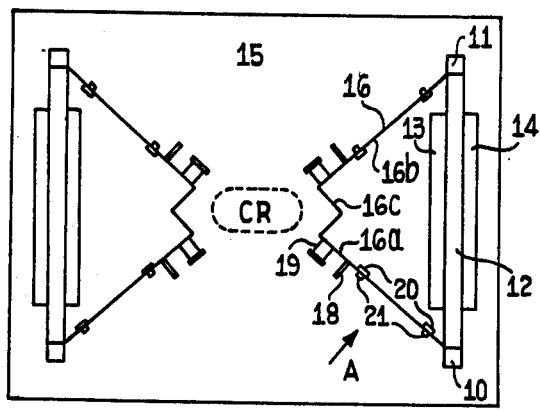
FIG. 1 shows a plan view, in abbreviated form, of a structure constituting a cabling-aid in accordance with the invention.

Referring to FIG. 1, the cabling-aid structure, represented in skeletonized form, comprises two substantially identical and inter-changeable frames of the same height as an equipment rack. Each frame is mainly fabricated from formed sheet-steel and square-section aluminium tubing. Considering the right-hand frame in particular; this comprises uprights 10 and 11 which are rigidly coupled together, top and bottom and at suitable spacings, by horizontal bracing members such as 12. The frame incorporates a W-section panel 16 formed from sheet-steel, and which is secured along the edges constituting the free ends of the W-shape to the uprights 10 and 11. The panel 16 is conveniently considered as comprising three integral sections of which 16a and 16b are face sections located about the re-entrant section 16c.

The two frames are capable of being mounted, as shown, upon a robust wooden base-plate 15, with the bracing member (such as 12) at the foot of each of them resting snugly in a channel produced by the steel rails 13 and 14 secured to the base-plate. The two channels so formed, upon the base plate, are at such a distance apart when the baseplate is correctly located and oriented on the exchange floor, the two frames resting in the channels and standing vertically can be secured (by means not shown) at their upper ends to spaced ceiling tie-bars which are eventually to be used for equipment-rack securing purposes.

The structure has a considerable resemblance to an inter-rack vertical cabling-duct of the 5005 System exchange; since the W-panels are comparable with the side-walls of two adjacent racks. However in the structure shown it has been found convenient, for accessibility reasons, to provide slightly more space between the W-panels as compared with that provided within a cable-duct proper. Also by comparison, the angle formed between face sections 16a and 16b is reduced slightly.

To cater for a 5005 System exchange having conventional racks with 10 shelves per face, the two face-sections (like section 16a shown in FIG. 2) of each frame of the structure has ten pairs of equi-spaced rectangular apertures such as 22 and 23; all the apertures being vertically aligned. The structure is substantially the same height as a conventional rack, and the pairs of apertures are so positioned that they correspond satisfactorily with pairs of tagblock-mounting cut-outs in the side-walls of any suite cable-duct. The width of each aperture is substantially the same as a said cut-out, but the height is slightly greater than that the corresponding tagblock-mounting cut-out so as to freely accommodate the height of a 14-strip wiring-biscuit.

Figure 2:
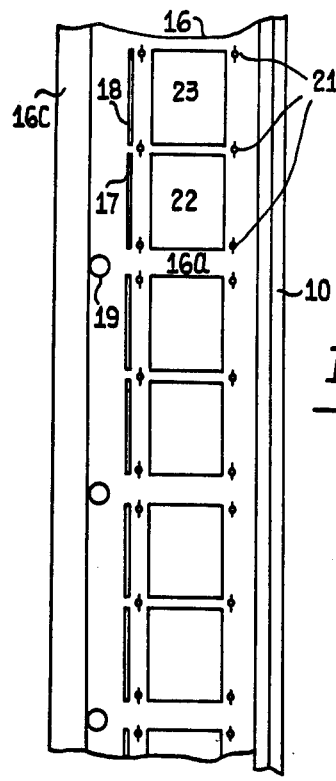

As illustrated in FIG. 2, each pair of apertures such as 22 and 23 has six wing-nuts 21 associated therewith; three to the left and three to the right. Each set of three is associated with a separate vertical clamp-bar each designated 20 in FIG. 1, at the remote (inside) surface of the face-section, so that a separate 15-strip wiring biscuit can be clamped for displaying the array of 14 × 15 perforations through each of the two apertures.

Also as can be seen in FIG. 2 fanning-strips such as 17 and 18 are provided on the basis one for each of the typical apertures 22 and 23. These are of flexible plastics material and are detachably secured by clips (not shown) to the surface of the face-section. Each such fanning-strip, located on that side of the aperture which is nearest to the re-entrant section 16c of the W-panel, is provided with 14 equi-spaced lateral holes; each for the accommodation of a cable-tail. Each fanning-strip is provided with slots, in its near edge, and each of these extends centrally into a corresponding aforesaid hole in the strip. The slot is sufficiently wide as to permit individual insulated wires to be passed laterally through it, and indeed the flexible nature of the strip will enable a cable tail of say 15 such wires to be gently tugged through the slit by temporary distortion of its walls.

A cable-forming bobbin 19 is associated with each of the ten pairs of apertures and fanning-strips of each of the two face-sections 16a and 16b of each of the two W-panels of the structure. Each bobbin of circular cross-section and having a raised outer rim is secured to the relevant face section at point slightly below each pair of apertures and close to the boundary of the re-entrant section.

It will be evident that the face sections 16a and 16b of W-panel 16 in combination with their components are symmetrical with respect to the re-entrant section 16c, and accordingly the cable-forming bobbins and fanning strips are directed towards the middle section. The same remarks apply to the other (left-hand) frame.

Figure 3:
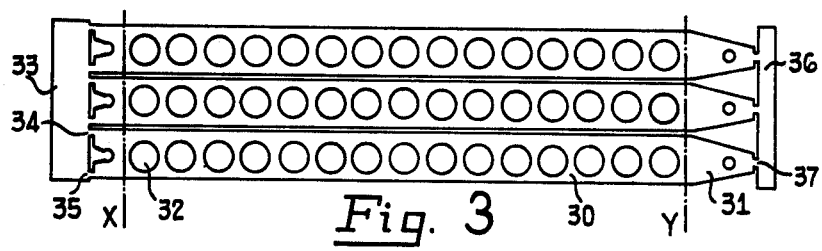
FIG. 3 shows part of a wire-locating plate (conveniently to be referred to as a biscuit) forming a plurality of identical perforated strips of plastics material; the biscuits comprising a predetermined number of the readily-separable strips being used in conjunction with the aforesaid structure.
Figure 4:
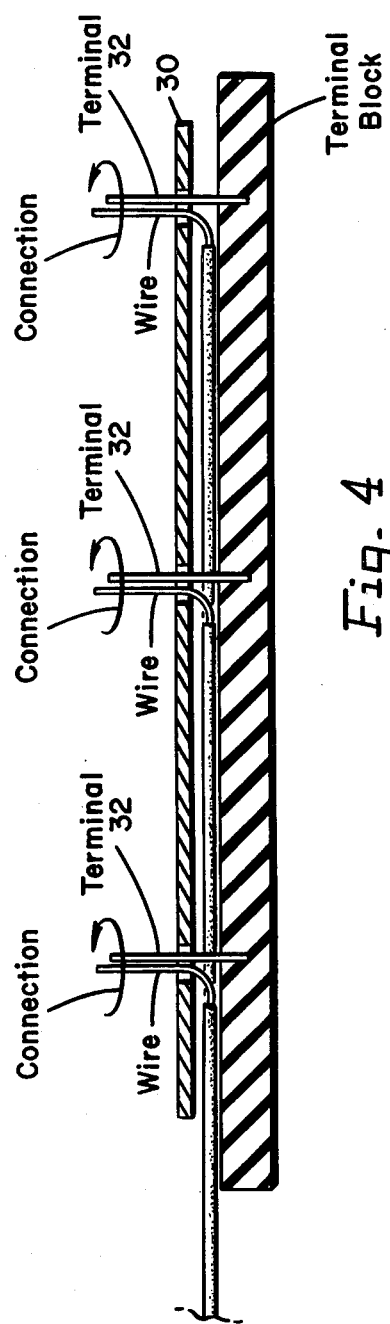
FIG. 4 is a schematic rendering of the placing of the plastic strip on the terminal block, with the wires and terminals emerging in the same direction.

FIG. 3 shows a portion of a wiring biscuit which is fabricated from a comparatively rigid grade of p.v.c. (polyvinylchloride) having a thickness of say 0.032 in. The illustration shows three identical perforated strip portions 30 joined to the common edge-portions 33 and 36 by the webs 34 and 35 to the left and 37 to the right. Each strip has 15 circular holes on centers corresponding to the centers of the 15 tags of a row of the particular shelf-tagblocks of the 5005 System; the diameter of each hole being such as to provide adequate clearance around such a tag complete with a wrapped joint.

The biscuits are preferably formed by a step-by-step punching process performed on a roll of p.v.c. material which produces the regular repetitive pattern along its length; 14-strip sections being parted-off to constitute the biscuits.

Figure 2A:
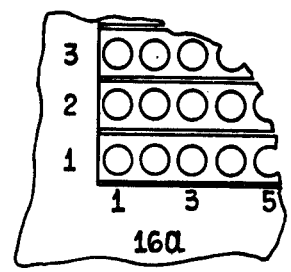
FIG. 2a illustrates the disposition of designation characters around a typical aperture of FIG. 2.

When a biscuit is secured at an aperture such as 22 or 23 (FIG. 2) by the clamp-plates 20 co-operating with the left-hand and right-hand extremities, the location of the biscuit is such that the full array of 14 × 15 perforations is displayed through the aperture. In FIG. 3, the broken lines X and Y correspond to the vertical edges of the aperture, and the upper and lower edges of the latter are slightly clear of the biscuit. As can be deduced from FIG. 2a, numerical designations on the margins of the apertures provide for identification of the individual perforations, in conformity with the connectiontags which they correspond to; the rows numbering "1" to "14" upwardly whilst the perforations of a strip number "1" to "15" always from the left.

The method of use of structures such as that outlined will now be dealt with. The number of bases and frames to be formed into the structures will depend on the size of the exchange to be installed and the availability of wiring and cabling personnel. However provision on the basis of one structure per rack-suite of the exchange may be adequate.

After marking the exchange-floor in terms of the locations and designations of the rack-suites and vertical cabling ducts, some or all of the exchange cabling is run-in and the cable-ends are brought-down through the mesh of the false ceiling at points immediately above the positions to be occupied by said ducts.

In the case of an intermediate cable-duct of a suite, a cabling-aid structure as described and comprising a base and two frames is erected in the duct-position; the lower ends of the frames being located between pair of members 13 and 14 on the base-board preparatory to the tops of the vertically-standing frames being secured in relation to the overhead rack tie-bars. At this juncture, the structure can be considered as simulating an actual inter-rack duct; further similarity is introduced by the addition of a wiring biscuit in each of those apertures which will correspond to each tagblock position which is to be equipped.

The wiring biscuits are always mounted so that the tapered ends such as 31 of the integral perforated strips are directed away from the re-entrant section of the W-panel.

It will be appreciated that the ends of the requisite installer's cables will be hanging down in the central region CR. It can be assumed that one of these cables is duly required to have its wires individually connected to tags of the tagblock simulated by the biscuit at aperture 23 or 22. The end region of this cable (identified, in respect of the tagblock, by a label secured to it) is skinned as required to gain access to the colour-coded p.v.c.-covered wires and brought fairly tautly below the related bobbin 19 before being drawn-up to the left of the appropriate flexible fanning-strip 17 or 18. The cable would be suitably laced in the vicinity of said bobbin where it forms a so-called swan-neck. The cable-man, consulting the relevant terminating information list which relates wire-colours to tagblock tags, deals with the wires a row-at-a-time. Thus starting (for example) with the wires for tagblock row number "1," he takes the wires for tag numbers "1" to "15" successively and pushes them fully into corresponding perforations in strip number "1;" each wire being also pushed laterally through a particular slit in the flexible fanning-strip for location in the first (lower) hole thereof.

Assuming that all tags of the ultimate tagblock are to be wired, 14 15-wire cable-tails are duly formed, and the last few inches of each wire of each tail disappears into a different perforation of a particular strip of the biscuit. The ends of the wires of each tail, emerging at the remote face of the biscuit are held against the back of the relevant strip and are twisted together beyond the tapered end 31 of the strip. In effect, each strip then merges lengthwise into the cable-tail. When all cables of the location have been dealt with, in this general manner, from appropriate faces of the structure, the clamping bars 20 are loosened by slightly unscrewing the wing nuts 21. The flexible nature of the biscuits then allows them to be withdrawn through the apertures. Also at this juncture the flexible fanning-strips, 18, are detached from the relevant W-panels to temporarily maintain the configuration of the various cable-tails.

The structure duly to be refitted with flexible fanning-strips may now be removed for use in another situation, leaving the cable-ends, formed with swan-necks and having wiring biscuits in situ, ready for the gun-wrapping phase to be effected when the rack-suites with there shelf-tagblocks are duly installed.

In the case of the vertical cabling-duct to be accommodated at the end of the last rack of a suite, it will be understood that a structure comprising one frame only is necessary.

In due course installation of the rack-suites proceeds so that vertical cable-ducts of equipped racks of the suite become available for the connecting-phase of the typical cluster of cables which is emerging from the ceiling mesh at a central position. The main run of the cables is positioned at the re-entrant section(s) at the ducts, and the formed cable-ends allow the various biscuits to appear in the vicinity of the related tagblocks.

Each cable-tail appertaining to any tagblock is now dealt with successively, say from bottom to top. Accordingly the lower strip (row or level 1) is separated from the biscuit by breaking the particular webs 34, 35 and 37, and the cable-tail is removed from the flexible fanning-strip. The perforated strip is then angularly set about its longitudinal axis so that the end portions of the wires now emerge through perforations, instead of disappearing through them. That is, the strip is rotated so that the wires emerge to face the operator. With the strip lying in line with the tail the twisted end of the latter is fed through an appropriate hole of a rigid fanning-strip associated with the tagblock. The perforated strip 30, tapered end foremost, is also taken through the fanning-strip, whereupon the perforations of strip 30 are passed over corresponding tags of the particular tagblock level, so that one wire and one tag appear through each hole. Preferably, if clockwise wrapping of wires is to be effected, the application of the strip is done so that each wire appears through the hole at a point above the related tag.

Starting with the tag nearest to the fanning strip (not necessary tag number "1"), gunning-wrapping of the individual wires with respect to the tags now proceeds using a power-driven gun, for rapidly performing a cutting, stripping and wrapping sequence for each tag. The possibility of the wire-man making an error is extremely unlikely since he is merely required to operate with respect to a wire and tag which emerge through the same hole. In the normal course of events, when a tag row has been completed the perforated strip would be lifted off the tags. However if it happens that any wire is wrapped on the wrong tag, the situation is made evident because the perforated strip cannot be withdrawn intact.

Although the invention has been described with respect to cabling preparation work before the siting of equipment racks of a telephone exchange, it is also adaptable for use in other circumstances. Thus the running-in of cables and the installation of equipment racks may be organised to proceed concurrently. In these circumstances it may happen that certain racks are not equipped (or only partly equipped) with shelves. Accordingly suitable frames may be provided for temporary location within a cable duct, and incorporating means for securing biscuits at aperture positions in proximity to the absent tagblocks.

What we claim is:

1. A method of operating on the end of a multi-conductor cable for connecting the cable to a terminal block having its terminals arranged in a co-ordinate field, the method including the steps of providing a flexible plastic plate comprising a plurality of integral readily-detached flexible strips, one strip for each row of terminals, said strip having a perforation corresponding to each terminal of a row, mounting the plate in a location close to the position to be occupied by the terminal block, threading insulated wires of a cable through particular holes of the plate, separating said strip from the plate, placing the strip upon a requisite row of terminals of the duly located terminal block so that one wire-end and one terminal-end emerge in the same direction from at least one of said perforations, connecting each said terminal and wire emerging from the same perforation by a power driven device, and then removing the flexible strip of plastic material after the terminal and wire have been connected provided that the terminal emerging from a perforation has been wired to the wire emerging from the same perforation.

2. A method as claimed in claim 1 wherein said mounting step comprises providing a cabling-aid structure comprising at least one frame having apertures in its wall, mounting said flexible plastic plate adjacent said aperture enabling the perforations of all the strips of said plate to be displayed in a position appropriate to that occupied or to be occupied by a terminal block, said threading step comprises inserting insulated wires to be connected to said terminal block through selected perforations of the strips of the plate.

3. A method of preparing and making connections between insulated wires of a cable and individual terminals arranged in rows on a terminal block comprising forming a cable tail comprising a number of wires of a cable inserted into perforations on an elongated flexible strip, the number of perforations corresponding to the number of terminals in a row, placing the cable tail upon the terminals of a row of terminals by placing the elongated flexible strip upon the terminals of a row so that one wire-end and one terminal-end emerge in the same direction from at least one of the perforations, connecting the wire to the terminal by a power driven device, and then removing the elongated flexible strip after the terminal and wire have been connected provided that the terminal emerging from a perforation has been wired to the wire emerging from the same perforation.

4. A method as claimed in claim 3 wherein the placing step comprises providing a fanning strip having a guide-hole for each row of terminals, feeding said cable tail through the guide hole of the fanning strip, and placing said flexible strip upon the terminals of a row of terminals.

5. The method as claimed in claim 3 wherein said forming step comprises providing a plate comprising a plurality of flexible plastic strips, each strip having perforations corresponding to the number of terminals in a terminal row, said flexible strips arranged in side-by-side formation and connected by connecting webs and having insultated wires of a cable inserted in said perforations, and then removing a flexible strip of plastic material from an adjacent flexible strip of plastic material to form a cable tail.

* * * * *